United States Patent
Lee et al.

(10) Patent No.: US 8,173,530 B2
(45) Date of Patent: May 8, 2012

(54) SEMICONDUCTOR DEVICE AND RELATED FABRICATION METHODS THAT USE COMPRESSIVE MATERIAL WITH A REPLACEMENT GATE TECHNIQUE

(75) Inventors: Doug H. Lee, Poughquag, NY (US); Kisik Choi, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 199 days.

(21) Appl. No.: 12/475,994

(22) Filed: Jun. 1, 2009

(65) Prior Publication Data
US 2010/0301401 A1    Dec. 2, 2010

(51) Int. Cl.
*H01L 21/3205* (2006.01)
(52) U.S. Cl. ........................................ 438/585; 438/595
(58) Field of Classification Search .................. None
See application file for complete search history.

(56) References Cited

U.S. PATENT DOCUMENTS

| | | | | |
|---|---|---|---|---|
| 2007/0099414 | A1* | 5/2007 | Frohberg et al. | 438/618 |
| 2008/0124877 | A1* | 5/2008 | Pei | 438/300 |
| 2010/0117154 | A1* | 5/2010 | Ye | 257/368 |

* cited by examiner

*Primary Examiner* — Fei Fei Yeung Lopez
(74) *Attorney, Agent, or Firm* — Ingrassia Fisher & Lorenz, P.C.

(57) ABSTRACT

A semiconductor device and related method of fabricating it are provided. An exemplary fabrication process begins by forming a gate structure overlying a layer of semiconductor material, the gate structure comprising a gate insulator overlying the layer of semiconductor material and comprising a temporary gate element overlying the gate insulator. The process continues by forming a layer of compressive material overlying the gate structure, and by removing a first portion of the compressive material to expose an upper surface of the temporary gate element, while leaving a second portion of the compressive material intact and external to sidewalls of the temporary gate element. Thereafter, at least a portion of the temporary gate element is removed, while leaving the second portion of the compressive material intact, resulting in a gate recess. The process continues by at least partially filling the gate recess with a gate electrode material.

14 Claims, 8 Drawing Sheets

SEMICONDUCTOR DEVICE AND RELATED FABRICATION METHODS THAT USE COMPRESSIVE MATERIAL WITH A REPLACEMENT GATE TECHNIQUE

TECHNICAL FIELD

Embodiments of the subject matter described herein relate generally to semiconductor devices. More particularly, the subject matter relates to a replacement gate technique that can be used while manufacturing transistor devices.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. Some transistor devices are fabricated using a replacement gate technique; in accordance with this technique, temporary gate material (typically polycrystalline silicon) is removed and then replaced with a different gate material (typically a metal). In this regard, FIG. 1 is a cross sectional view of a semiconductor device structure 100 in a state prior to removal of temporary gate material 102. The temporary gate material 102 is located between two sidewall spacers 104.

Ideally, the sidewall spacers 104 retain their shape after the temporary gate material 102 has been removed. The resulting space between the sidewall spacers 104 can then be filled with the replacement gate material. Unfortunately, the sidewall spacers 104 tend to bend or deform inwardly after removal of the temporary gate material 102. FIG. 2 is a cross sectional view of the semiconductor device structure 100 after the temporary gate material 102 has been removed. FIG. 2 depicts (in an exaggerated manner) how the sidewall spacers 104 deflect inwardly toward each other in the absence of the temporary gate material 102. It becomes difficult or impossible to fill the space 106 with the replacement gate material when the sidewall spacers 104 are deflected in this manner. This problem is exacerbated when small manufacturing node technologies (e.g., 32 nm and beyond) are employed to fabricate the semiconductor devices.

BRIEF SUMMARY

A method of fabricating a semiconductor device is provided. The method forms a gate structure overlying a layer of semiconductor material, where the gate structure includes a gate insulator overlying the layer of semiconductor material, and a temporary gate element overlying the gate insulator. The temporary gate element may include a certain type of metal layer for protection of the gate insulator. The method continues by forming a layer of compressive material overlying the gate structure, removing a first portion of the compressive material to expose an upper surface of the temporary gate element, while leaving a second portion of the compressive material intact and external to sidewalls of the temporary gate element. The method then removes at least a portion of the temporary gate element, while leaving the second portion of the compressive material intact. This results in a gate recess, which is at least partially filled with a gate electrode material.

Another method of fabricating a semiconductor device is also provided. This method begins by providing a device structure having a gate structure overlying a layer of semiconductor material. The gate structure includes a gate insulator overlying the upper surface of the semiconductor material, and a temporary gate element overlying the gate insulator. The temporary gate element may include a certain type of metal layer for protection of the gate insulator. The method continues by forming a layer of offsetting material overlying the gate structure, such that the height of the offsetting material above the upper surface of the semiconductor material is less than half of the height of the gate structure. Next, the method forms a layer of compressive material overlying the offsetting material. Thereafter, the method removes some of the compressive material and some of the offsetting material to expose an upper surface of the temporary gate element, while leaving some of the compressive material and some of the offsetting material intact and external to sidewalls of the temporary gate element. Next, the temporary gate element is removed to form a gate recess, and the gate recess is filled with a gate electrode material.

Also provided is a semiconductor device, which includes a layer of semiconductor material, a gate insulator overlying the semiconductor material, and a gate electrode overlying the gate insulator and having sidewalls. The gate electrode is formed in accordance with a replacement gate technique. The semiconductor device also includes regions of compressive material adjacent to the gate electrode and coupled to the sidewalls.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. In particular, the process steps described here can be utilized in conjunction with any semiconductor device fabrication process that forms gate structures for transistors. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 3:
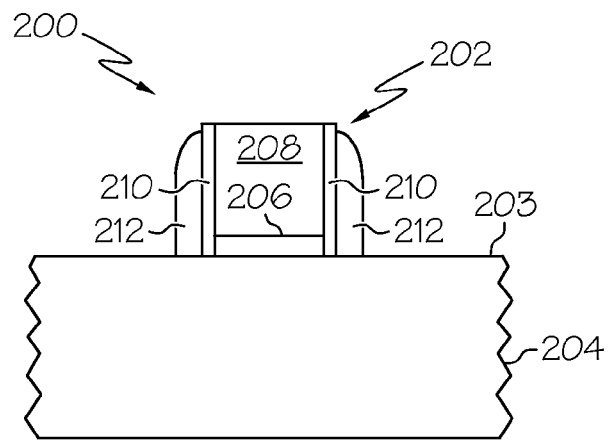
FIGS. 3-12 are cross sectional views that illustrate an exemplary semiconductor device structure and a method of fabricating it.

FIG. 3 depicts the fabrication state of a device structure 200 after formation of a gate structure 202 overlying a layer of semiconductor material 204. The device structure 200 is formed using well known techniques and process steps (e.g., techniques and steps related to doping, photolithography and patterning, etching, material growth, material deposition, surface planarization, and the like) that will not be described in detail here. The semiconductor material 204 is preferably a silicon material as typically used in the semiconductor industry, e.g., relatively pure silicon as well as silicon admixed with other elements such as germanium, carbon, and the like. Alternatively, the semiconductor material 204 can be germanium, gallium arsenide, or the like. The semiconductor material 204 can be either N-type or P-type, but is typically P-type, with wells of the appropriate type formed therein. The semiconductor material 204 may be provided as a bulk semiconductor substrate, or it could be provided on a silicon-on-insulator (SOI) substrate, which includes a support substrate, an insulator layer on the support substrate, and a layer of silicon material on the insulator layer.

For this particular example, the gate structure 202 includes, without limitation: a gate insulator 206 overlying the upper surface 203 of the semiconductor material 204; a temporary gate element 208 overlying the gate insulator 206; liners 210 adjacent to the temporary gate element 208; and spacers 212 adjacent to the liners 210. Although not shown in FIG. 3, the gate structure 202 may also include a sacrificial cap layer (which may be formed from a nitride, a silicide, or other material) on the temporary gate element 208. The temporary gate element 208 may also include certain material, such as TiN, over the gate insulator 206. This metal layer protects the gate insulator 206 during the temporary gate removal steps (described below).

The material used for the gate insulator 206 can be a layer of thermally grown silicon dioxide or, alternatively, a deposited insulator such as a silicon oxide, silicon nitride, any kind of high-k oxide such as hafnium oxides, or the like. Deposited insulators can be deposited, for example, by chemical vapor deposition (CVD), atomic layer deposition (ALD), low pressure chemical vapor deposition (LPCVD), or plasma enhanced chemical vapor deposition (PECVD). The gate insulator material preferably has a thickness of about 1-10 nm, although the actual thickness can be determined based on the application of the transistor in the circuit being implemented. The material for the temporary gate element 208 is formed overlying the gate insulator material. In accordance with certain embodiments, the material used for the temporary gate element 208 includes a thin metal layer underlying polycrystalline silicon, although other replaceable materials could be used instead of polycrystalline silicon. The layer of polycrystalline silicon is preferably deposited, e.g., using LPCVD by the hydrogen reduction of silane. Typically, the polycrystalline silicon will have a thickness within the range of about 50-100 nm. Thereafter, the polycrystalline silicon, the thin metal layer, and the underlying gate insulator material are etched using an appropriate etch mask (not shown).

The liners or offset spacers 210 are formed on the sidewalls of the temporary gate element 208 and the sidewalls of the gate insulator 206. In practice, the liners 210 are created by depositing thin films such as silicon oxide or silicon nitride over the exposed sections of the temporary gate element 208, the gate insulator 206, and the silicon substrate. Thus, the liners or offset spacers 210 are realized after a conventional offset spacer etch. Thereafter, the spacers 212 are fabricated in a conventional manner. In this regard, the spacers 212 can be formed by conformally depositing a dielectric material over the wafer, where the dielectric material is an appropriate insulator, such as silicon nitride. If nitride is used for the spacers 212, then it will be realized using a "normal" nitride material that has little or no strain-inducing properties. The dielectric spacer material can be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacers 212 formed from the layer have a thickness that is appropriate for the subsequent process steps described below. In typical implementations, the layer of dielectric spacer material is deposited to a thickness of about 5-50 nm. The process continues, in accordance with an exemplary embodiment, with anisotropic etching of the layer of dielectric spacer material to form the spacers 212, as illustrated in FIG. 3. The layer of dielectric spacer material can be etched by, for example, RIE using a suitable etching chemistry.

Figure 4:
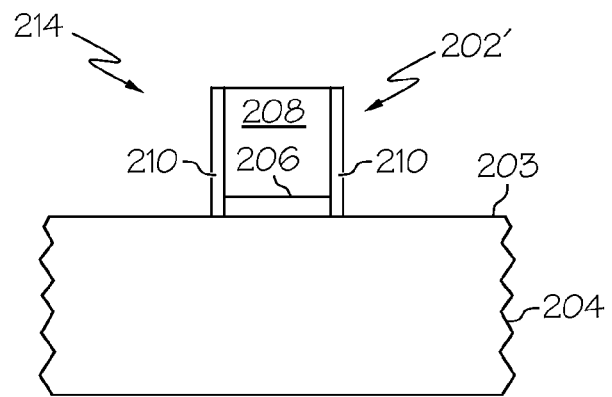
Figure 5:
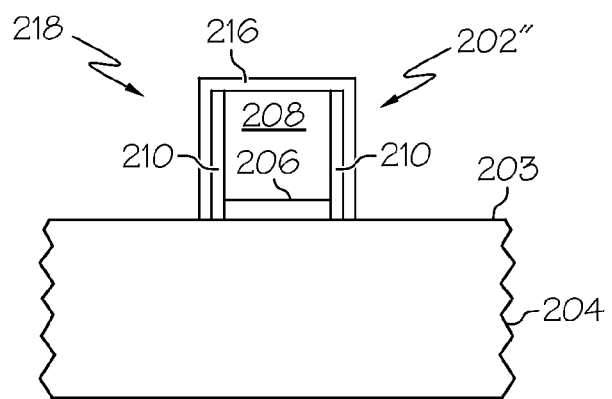

The spacers 212 can be used to protect the underlying semiconductor material 204 during ion implantation associated with the formation of source/drain extension implants, halo implants, and/or deep source/drain implants, as is well understood. In preferred embodiments, the spacers 212 are removed after completion of the various ion implantation steps (and/or the completion of the process steps that utilize the spacers 212). FIG. 4 depicts the device structure 214 and the gate structure 202' after the spacers 212 have been removed. The spacers 212 can be removed by a selective etching technique that uses a wet etchant having an appropriate chemistry. Notably, this selective etching step leaves the liners 210 completely or substantially intact. Thereafter, the fabrication process may continue by forming a suitable encapsulation layer 216 over the gate structure 202'. FIG. 5 depicts the device structure 218 and the gate structure 202" after formation of the encapsulation layer 216. The encapsulation layer 216 is formed from an appropriate material, such as an oxide, and the thickness of the encapsulation layer 216 is typically within the range of about 1.0 to 10 nm. The additional encapsulation layer 216 can be deposited by conventional techniques such as ALD, LPCVD, PECVD, and the like. The encapsulation layer 216 provides additional protection of the thin metal and gate insulator layers. The encapsulation layer 216 can be left intact or the horizontal portion of the liners can be removed by directional etching.

Figure 6:
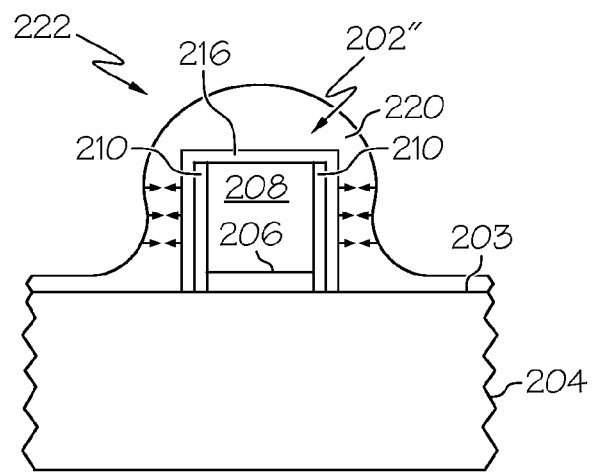

After formation of the encapsulation layer 216, the process continues by forming a layer of compressive material 220 overlying the gate structure 202". FIG. 6 depicts the state of the device structure 222 after creation of the layer of compressive material 220. In preferred embodiments, the compressive material 220 is an insulating material such as a compressive nitride material. As used herein, a "compressive material" is a material, such as silicon nitride, that has strain-inducing characteristics that result in stress directed in an inward direction (in other words, the material tends to shrink). The inward facing arrows within the compressive material 220 in FIG. 6 represent this compressive stress.

The compressive material 220 can be conformally deposited over the device structure 218 using, for example, CVD, LPCVD, or the like. As depicted in FIG. 6, the compressive material 220 is preferably deposited such that it completely covers and surrounds the gate structure 202". In practice, some of the compressive material 220 will also be deposited onto the exposed upper surface 203 of the semiconductor material 204. Moreover, the compressive material 220 could fill in some or all of the space between adjacent gate structures fabricated on a common wafer. The thickness of the compressive material 220 on top of the gate structure 202" will typically be within the range of about 300-600 Angstroms, although the actual thickness need not always be within this range. In this regard, the actual thickness and compressive properties of the compressive material 220 may be adjusted to obtain the desired effect (described below).

Figure 7:
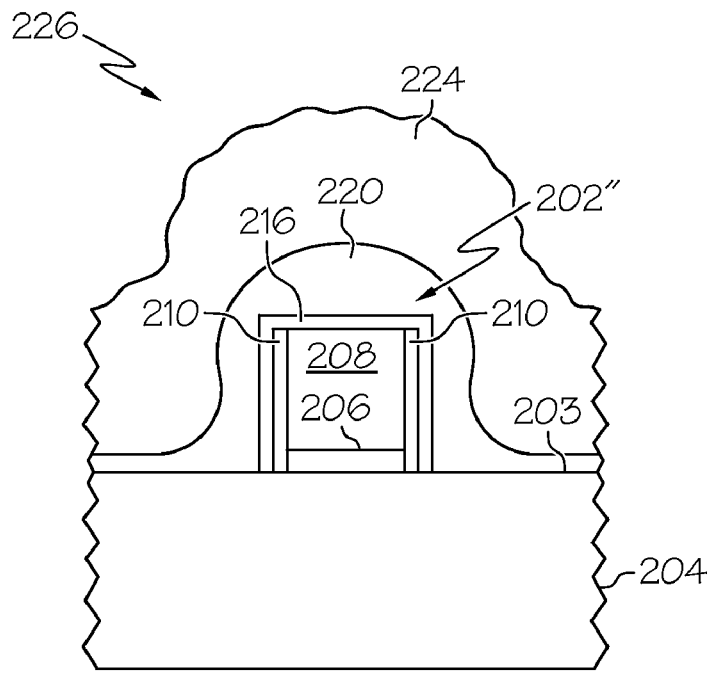

Although other fabrication steps or sub-processes may be performed after the compressive material 220 has been deposited, this example continues by forming a buffer layer 224 overlying the compressive material 220. FIG. 7 depicts the state of the device structure 226 after formation of this buffer layer 224. In certain embodiments, the buffer layer 224 is formed from an insulating material such as a neutral stress nitride. The material used for the buffer layer 224 is conformally deposited over the exposed areas of the device structure 222 (FIG. 6) to fill in spaces and gaps between protruding features. Preferably, the buffer layer 224 is deposited such that its minimum height above the upper surface 203 of the semiconductor material 204 exceeds the height of the gate structure 202". This specified height is desirable to provide a uniform surface topology for subsequent polishing step(s), as described below.

Figure 8:
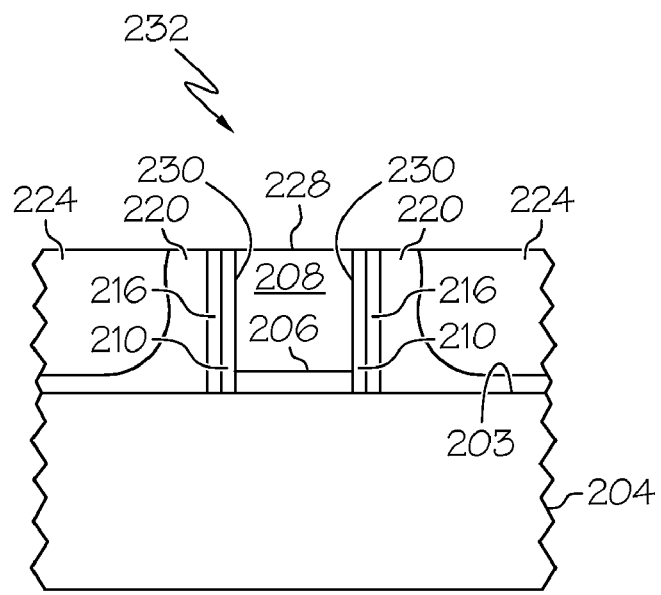

After formation of the buffer layer 224, the manufacturing process may continue by adding additional CMP buffer layers such as oxides, then by removing a portion of the top oxide layer and buffer layer 224 and a portion of the compressive material 220, to expose an upper surface 228 of the temporary gate element 208 (FIG. 8). This material removal step leaves a portion of the buffer layer 224 and a portion of the compressive material 220 intact, as shown in FIG. 8. Consequently, some of the compressive material 220 remains in place, external to the sidewalls 230 of the temporary gate element 208. FIG. 8 depicts the state of the device structure 232 after the removal of the desired amount of the buffer layer 224 and the compressive material 220.

The processing of the device structure 226 (FIG. 7) into the device structure 232 (FIG. 8) may involve one or more polishing or planarizing steps. For example, the wafer may be subjected to chemical mechanical polishing to polish and planarize its exposed surface. In practice, the CMP buffer layer will be polished first, then the buffer layer 224 will be polished, and then eventually the compressive material 220 will become exposed and polished. This example assumes that the upper portion of the encapsulation layer 216 is polished away to expose the upper surface 228 of the temporary gate element 208. In this regard, the material used for the temporary gate element 208 (e.g., polycrystalline silicon) or a sacrificial cap layer on the temporary gate element 208 (not shown) could be used as a stop or marker layer during the polishing step. Accordingly, the device structure 232 shown in FIG. 8 can be obtained by controlling the polishing in an appropriate manner.

Figure 9:
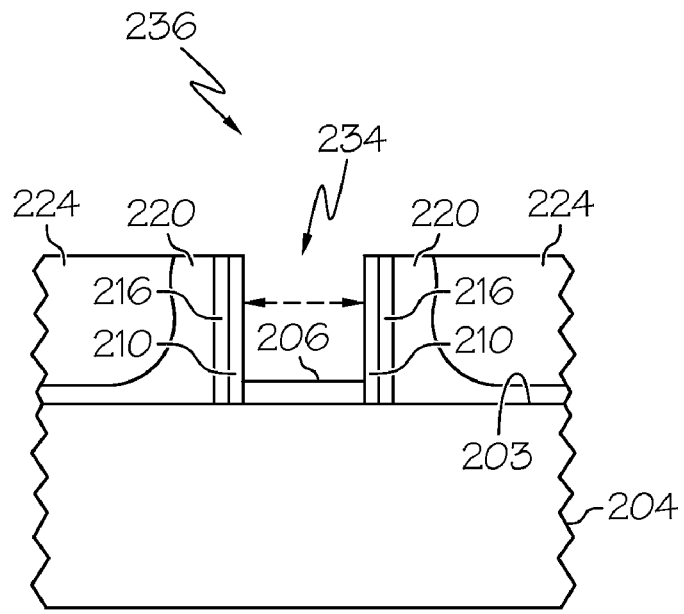

Although other fabrication steps or sub-processes may be performed after the polishing step, this example continues by removing at least a portion of the temporary gate element 208, resulting in a gate recess 234 (FIG. 9). In certain embodiments, the temporary gate element 208 is completely removed from the device structure 232 (FIG. 8). FIG. 9 depicts the state of the device structure 236 after removal of the temporary gate element 208. Notably, the remaining portions of the compressive material 220 are left intact surrounding the gate recess 234. Thus, the gate recess 234 is defined (at least in part) by the surrounding portion of the compressive material 220. For the illustrated embodiment, the remaining portions of the buffer layer 224 are also left intact.

The temporary gate element 208 is removed using an appropriate etchant chemistry that selectively etches the material used for the temporary gate element 208. This selective etch has little or no affect on the other exposed device elements, including the material used for the buffer layer 224, the compressive material 220, the material used for the encapsulation layer 216, the material used for the liners 210, and the gate insulator 206. The etchant chemistry, the etching conditions, the duration of the etching process, and other factors can be controlled as needed to ensure that the temporary gate element 208 is removed.

Figure 1:
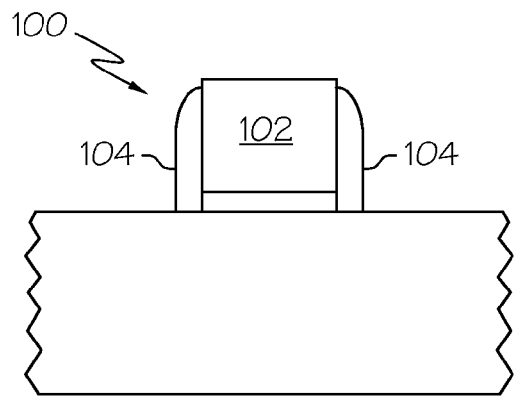
FIG. 1 is a cross sectional view of a semiconductor device structure prior to removal of temporary gate material.
Figure 2:
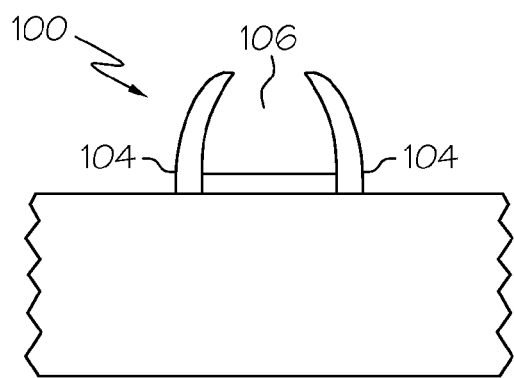
FIG. 2 is a cross sectional view of the semiconductor device structure shown in FIG. 1, after removal of the temporary gate material.

The strain-inducing properties of the compressive material 220 help to maintain the dimensions of the gate recess 234, and help to minimize or prevent the collapsing phenomena described above with reference to FIG. 2. As mentioned above, the compressive material 220 tends to shrink, thus imparting an outward pulling force on the remaining material used for the encapsulation layer 216 and on the liners 210. This outward pulling force helps to preserve the width of the gate recess 234 (represented by the dashed double-headed arrow in FIG. 9), which in turn makes it easier to fill the gate recess 234 with replacement gate material.

Figure 10:
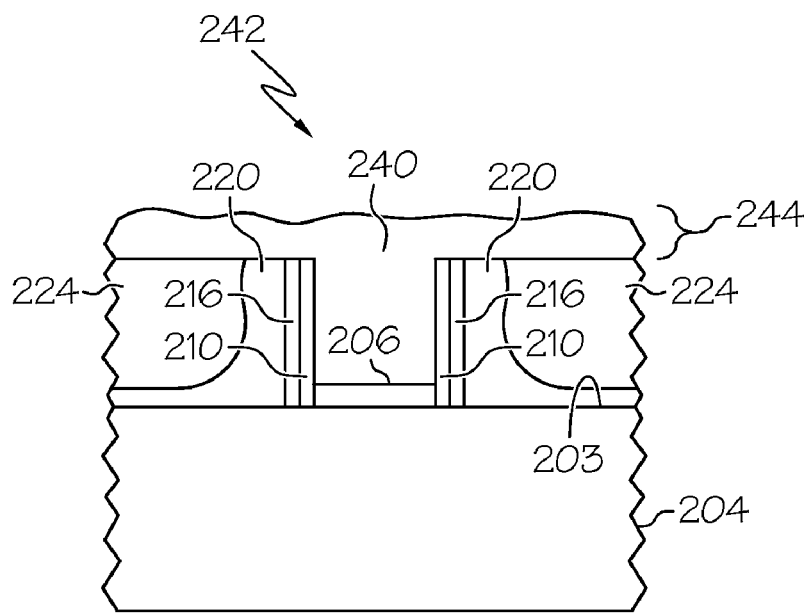

Although other fabrication steps or sub-processes may be performed after the removal of the temporary gate element 208, this example continues by at least partially filling the gate recess 234 with a gate electrode material 240. In certain embodiments, the gate recess 234 is completely filled with the gate electrode material 240. FIG. 10 depicts the state of the device structure 242 after the gate recess 234 has been filled with the gate electrode material 240. The gate electrode material 240 may be a metal such as tungsten, titanium nitride, or the like. Accordingly, the gate electrode material 240 could be formed by electroplating, CVD, ALD, or PVD. In preferred embodiments, the gate electrode material 240 is conformally deposited on the wafer using CVD or ALD. In this regard, the gate electrode material 240 is deposited in the gate recess 234 and overlying exposed portions of the other device structures (e.g., the exposed surfaces of the liners 210, the material used for the encapsulation layer 216, the compressive material 220, and the material used for the buffer layer 224). FIG. 10 depicts the device structure 242 with excess and overburden portions 244 of the gate electrode material 240 deposited on the wafer. Such excess and overburden portions 244 form when filling the gate recess 234; this ensures that the gate recess 234 is completely filled with the replacement gate electrode material 240.

Figure 11:
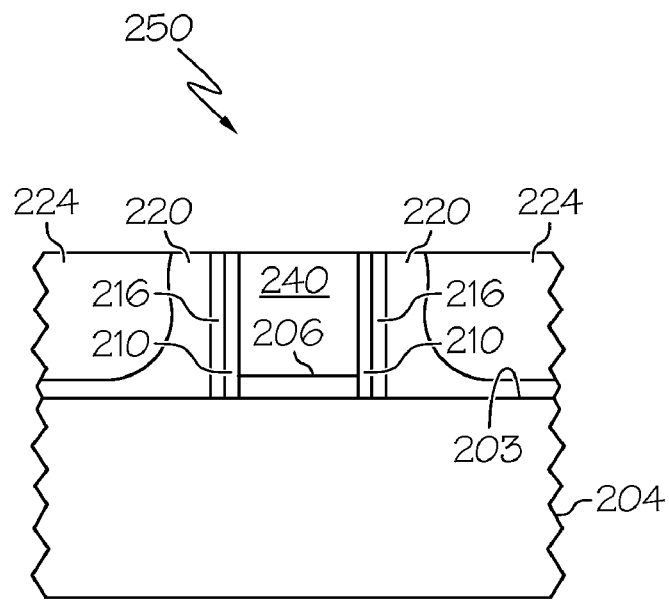

After the gate recess 234 has been filled, the fabrication process may continue by removing the excess and overburden portions 244 of the gate electrode material 240. FIG. 11 depicts the state of the device structure 250 after removal of the excess and overburden portions 244. The removal of the excess and overburden portions 244 may involve one or more polishing or planarizing steps. For example, the wafer may be subjected to chemical mechanical polishing to polish and planarize its exposed surface. This example assumes that the excess and overburden portions 244 of the gate electrode material 240 are completely polished away, such that the remaining gate electrode material 240 is level with the other features of the device structure 250. In practice, the chemical mechanical polishing process is controlled in an appropriate manner to obtain the device structure 250 shown in FIG. 11.

Figure 12:
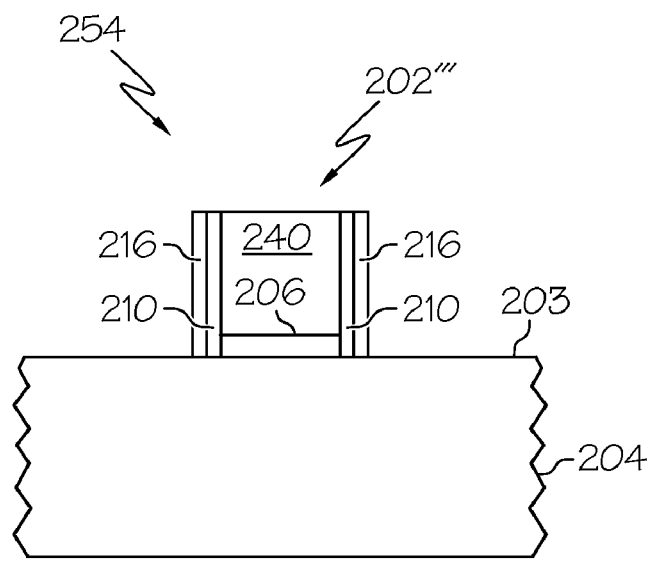

Although not required, it may be desirable to selectively remove some sections of the compressive material 220 that reside adjacent to sidewalls of the gate electrode material 240. The compressive material 220 need not be removed if its presence does not adversely affect the performance of the intended semiconductor device. For example, if an NMOS transistor device is being fabricated, then compressive material located near the gate could negatively impact performance. Thus, it may be beneficial to remove the compressive material 220 that is near the gate structure. In this regard, FIG. 12 depicts the state of the device structure 254 after removal of the compressive material 220 and the buffer material 224. The device structure 254 can be obtained by selectively etching the compressive material 220 and the buffer layer 224, while leaving the gate structure 202''' intact. A suitably etch chemistry is preferably used to etch away the compressive material 220 near the gate structure 202''' and the buffer layer 224. Thereafter, any number of known process steps can be performed to complete the fabrication of the MOS transistor device. For the sake of brevity, these process steps and the resulting MOS transistor device are not shown or described here.

FIGS. 13-18 are cross sectional views that illustrate another exemplary semiconductor device structure and a method of fabricating it. Some of the device features, structures, and process steps are similar, identical, or equivalent to counterparts described above with reference to FIGS. 3-12. For the sake of brevity, common features, structures, and process steps will not be redundantly described in detail here with reference to FIGS. 13-18.

Figure 13:
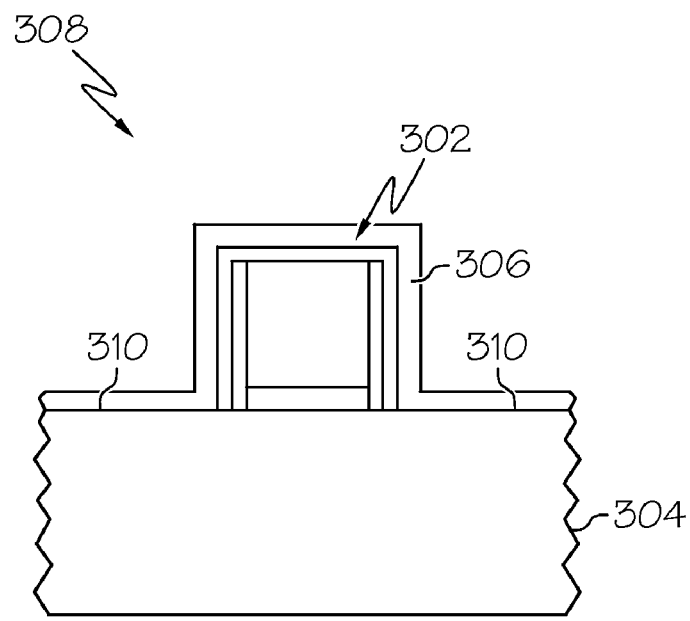
FIGS. 13-18 are cross sectional views that illustrate another exemplary semiconductor device structure and a method of fabricating it.

The following description assumes that the device structure 218 depicted in FIG. 5 has already been formed. In this regard, FIG. 13 shows a similar gate structure 302 formed overlying a layer of semiconductor material 304. After formation of the gate structure 302, this version of the fabrication process continues by forming a layer of offsetting material 306 overlying the gate structure 302. FIG. 13 depicts the state of the device structure 308 after creation of the layer of offsetting material 306. In certain embodiments, the offsetting material 306 is an insulating material such as a nitride material. Notably, the offsetting material 306 has little to no strain-inducing characteristics. In practice, the offsetting material 306 could be a low compressive material, relative to the compressive material used in the subsequent process step described below. For preferred embodiments, the offsetting material 306 is a non-compressive nitride material.

The offsetting material 306 can be conformally deposited over the gate structure 302 using, for example, CVD, LPCVD, or the like. The actual height of the offsetting material 306 above the upper surface 310 can be controlled to achieve the desired effect of the compressive material, as will become apparent from the following description.

Figure 14:
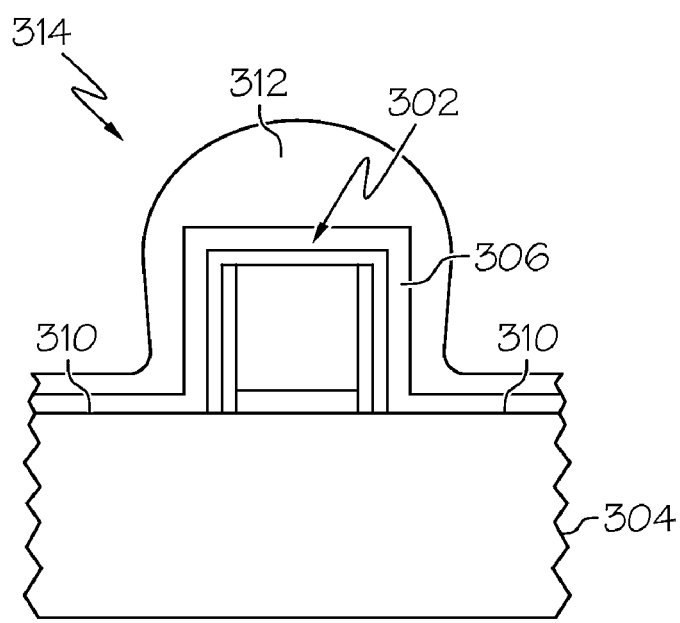

After depositing the offsetting material 306, the process continues by forming a layer of compressive material 312 overlying the offsetting material 306. FIG. 14 depicts the state of the device structure 314 after creation of the layer of compressive material 312. The compressive material 312 may be a compressive nitride material having the characteristics and properties described above for the first embodiment. As mentioned previously, the compressive material 312 is a relatively high compressive material, while the offsetting material 306 is a relatively low compressive material. The compressive material 312 can be conformally deposited over the offsetting material 306 using, for example, ALD, CVD, LPCVD, PECVD, or the like.

Figure 15:
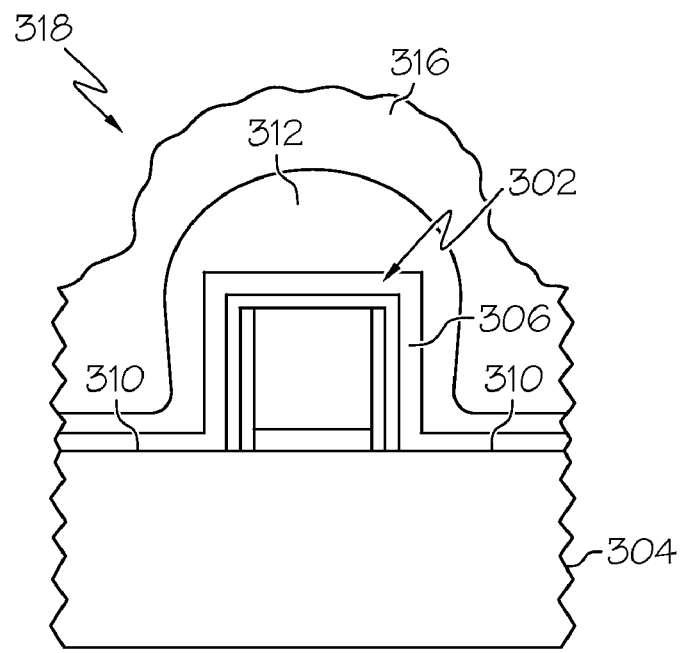

Although other fabrication steps or sub-processes may be performed after the compressive material 312 has been deposited, this example continues by forming a buffer layer 316 overlying the compressive material 312. FIG. 15 depicts the state of the device structure 318 after formation of this buffer layer 316. An additional oxide CMP buffer layer may be needed to assist CMP planarization. As described above, the buffer layer 316 may be a conformally deposited nitride material. The combined buffer layers of nitride and oxide serve to provide a uniform surface topology for subsequent polishing of the wafer.

Figure 16:
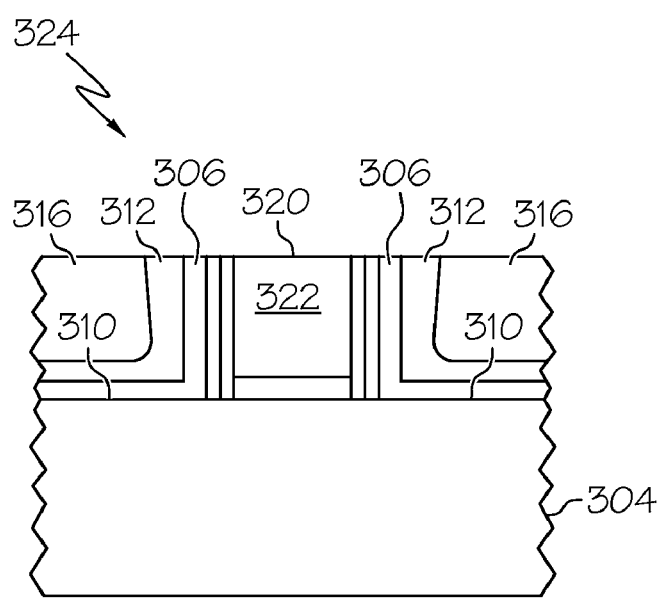

After formation of the buffer layer 316 and oxide CMP buffer layer, the manufacturing process may continue by removing a portion of the oxide and buffer layer 316, some of the compressive material 312, and some of the offsetting material 306 (FIG. 16). This material removal step exposes an upper surface 320 of the temporary gate element 322, while leaving a portion of the buffer layer 316, a portion of the compressive material 312, and a portion of the offsetting material 306 intact, as shown in FIG. 16. Consequently, some of the compressive material 312 remains in place, external to the temporary gate element 322. FIG. 16 depicts the state of the device structure 324 after this material removal step. As explained above, chemical mechanical polishing or planarizing may be used to remove the desired amount of material during this step.

Notably, the offsetting material 306 that overlies the upper surface 310 of the semiconductor material 304 serves as a base or a platform that raises the compressive material 312 above the upper surface 310. In contrast, the compressive material 220 used in the previously described embodiment (see FIG. 11) is formed from the bottom to the top of the gate structure. Referring again to FIG. 16, the amount of offsetting material 306 deposited onto the upper surface 310 can be controlled to achieve the desired offset height of the compressive material 312. Positioning the compressive material 312 near the top of the gate structure may be desirable to prevent sidewall collapse without overly stressing the gate structure. Moreover, this offsetting approach makes it easier to control the amount of stress imparted by the compressive material 312 to the top and bottom regions of the gate structure.

Figure 17:
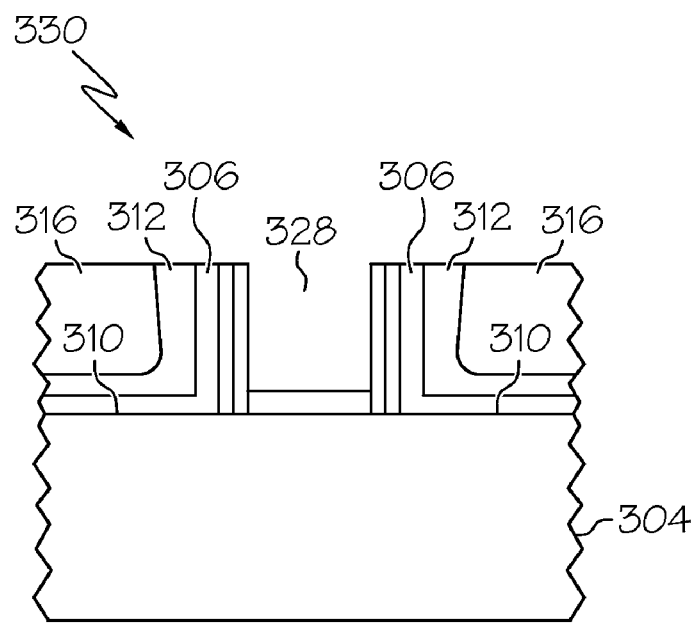

Although other fabrication steps or sub-processes may be performed after the polishing step, this example continues by removing at least a portion of the temporary gate element 322, resulting in a gate recess 328 (FIG. 17). In certain embodiments, the temporary gate element 322 is completely removed by etching, as described above for the embodiment depicted in FIGS. 3-12. FIG. 17 depicts the state of the device structure 330 after removal of the temporary gate element 322. Notably, the remaining portions of the offsetting material 306, the remaining portions of the compressive material 312, and the remaining portions of the buffer layer 316 are left intact surrounding the gate recess 328.

Figure 18:
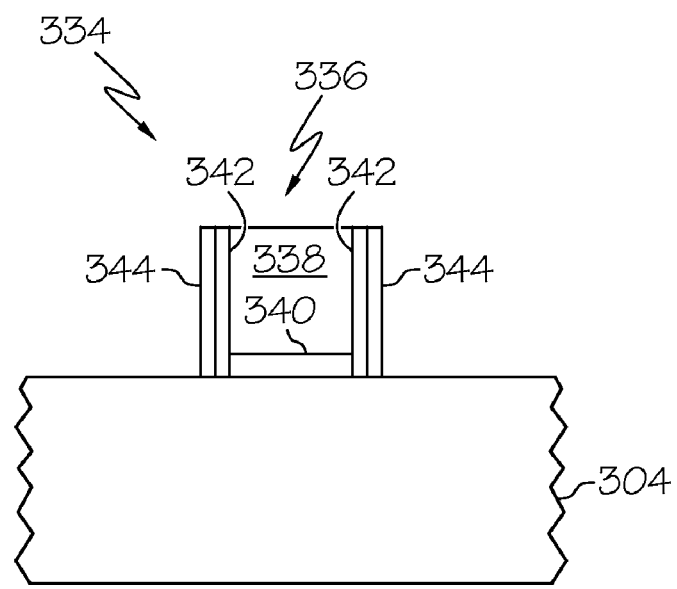

The compressive material 312 helps to maintain the dimensions of the gate recess 328, and helps to minimize or prevent the collapsing phenomena described above with reference to FIG. 2. This makes it easier to fill the gate recess 328 with replacement gate material, e.g., a conductive metal. In this regard, the device structure 330 shown in FIG. 17 can be further processed by filling the gate recess 328 with gate electrode material, and by removing excess and overburden portions of the gate electrode material (as described above for the embodiment shown in FIGS. 3-12. Thereafter, the process may continue by selectively removing all the nitrides, including the nitride buffer layer 316, the compressive material 312, and the offsetting material 306. FIG. 18 depicts the state of the device structure 334 after completion of these optional steps. The device structure 334 features a gate structure 336 that includes the replacement gate electrode material 338 overlying a gate insulator 340. Thereafter, any number of known process steps can be performed to complete the fabrication of the MOS transistor device. For the sake of brevity, these process steps and the resulting MOS transistor device are not shown or described here.

Although the fabrication processes described above remove some of the compressive material 220/312 after creating the replacement gate electrode, such removal is optional. In other words, the resulting device structure may include regions of compressive material adjacent to the gate electrode and coupled to the sidewalls of the gate electrode. In this regard, the compressive material 220 as depicted in FIG. 11 may remain intact, and the compressive material 312 as depicted in FIG. 16 may remain intact.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
    forming a gate structure overlying a layer of semiconductor material, the gate structure comprising a gate insulator overlying the layer of semiconductor material and comprising a temporary gate element overlying the gate insulator;
    forming a layer of compressive material overlying the gate structure;
    removing a first portion of the compressive material to expose an upper surface of the temporary gate element, while leaving a second portion of the compressive material intact and external to sidewalls of the temporary gate element;
    removing at least a portion of the temporary gate element, while leaving the second portion of the compressive material intact, resulting in a gate recess;
    at least partially filling the gate recess with a gate electrode material; and
    selectively removing sections of the compressive material that reside adjacent to sidewalls of the gate electrode material.

2. The method of claim 1, wherein the step of at least partially filling the gate recess completely fills the gate recess with a metal material.

3. The method of claim 1, wherein the step of removing at least a portion of the temporary gate element completely removes the temporary gate element.

4. The method of claim 1, wherein the gate recess is defined by the second portion of the compressive material.

5. The method of claim 1, wherein the step of forming the layer of compressive material comprises depositing a compressive nitride material overlying the gate structure.

6. The method of claim 1, wherein the step of removing a first portion of the compressive material comprises polishing the layer of compressive material.

7. The method of claim 1, wherein the step of at least partially filling the gate recess comprises depositing the gate electrode material in the gate recess, and overlying exposed portions of the compressive material.

8. The method of claim 7, further comprising removing excess and overburden portions of the gate electrode material.

9. A method of fabricating a semiconductor device, the method comprising:
    providing a device structure having a gate structure overlying a layer of semiconductor material, the gate structure comprising a gate insulator overlying the upper surface of the semiconductor material and comprising a temporary gate element overlying the gate insulator;
    forming a layer of offsetting material overlying the gate structure, such that the height of the offsetting material above the upper surface of the semiconductor material is less than the height of the gate structure;
    forming a layer of compressive material overlying the offsetting material;
    removing some of the compressive material and some of the offsetting material to expose an upper surface of the temporary gate element, while leaving some of the compressive material and some of the offsetting material intact and external to sidewalls of the temporary gate element;
    thereafter, selectively removing the temporary gate element to form a gate recess;
    thereafter, filling the gate recess with a gate electrode material; and
    selectively removing sections of the compressive material that reside adjacent to sidewalls of the gate electrode material;
    wherein the compressive material is a relatively high compressive material, and the offsetting material is a relatively low compressive material.

10. The method of claim 9, wherein the compressive material is a compressive nitride material, and the offsetting material is a non-compressive nitride material.

11. The method of claim 9, wherein the removing step comprises planarizing the compressive material and the offsetting material.

12. The method of claim 9, wherein the step of filling the gate recess comprises depositing metal in the gate recess, and overlying exposed portions of the compressive material.

13. The method of claim 12, further comprising removing excess and overburden portions of the metal.

14. The method of claim 9, further comprising selectively removing sections of the offsetting material that reside adjacent to sidewalls of the gate electrode material.

* * * * *